United States Patent
Schulz

(10) Patent No.: US 10,126,344 B2
(45) Date of Patent: Nov. 13, 2018

(54) METHOD FOR MEASURING ELECTRICAL ISOLATION OF A VEHICLE CHASSIS

(71) Applicant: Faraday&Future Inc., Gardena, CA (US)

(72) Inventor: Steven E. Schulz, Torrance, CA (US)

(73) Assignee: FARADAY&FUTURE INC., Gardena, CA (US)

(*) Notice: Subject to any disclaimer, the term of this patent is extended or adjusted under 35 U.S.C. 154(b) by 157 days.

(21) Appl. No.: 14/975,289

(22) Filed: Dec. 18, 2015

(65) Prior Publication Data

US 2017/0176509 A1 Jun. 22, 2017

(51) Int. Cl.
 G01R 31/12 (2006.01)
 G01R 31/00 (2006.01)

(52) U.S. Cl.
 CPC .......... G01R 31/006 (2013.01); G01R 31/12 (2013.01)

(58) Field of Classification Search
 CPC ...... G01R 31/00; G01R 31/006; G01R 31/12; G01R 27/00; G01R 27/02; G01R 27/08; G01R 27/14; G01R 27/18; G01R 27/20
 See application file for complete search history.

(56) References Cited

U.S. PATENT DOCUMENTS

| | | | | |
|---|---|---|---|---|
| 5,818,236 A * | 10/1998 | Sone | ..................... | B60L 3/0023 324/509 |
| 2014/0084934 A1* | 3/2014 | Bober | .................. | G01R 27/025 324/434 |
| 2015/0276846 A1* | 10/2015 | Paris | ..................... | G01R 27/025 702/65 |
| 2015/0343903 A1* | 12/2015 | Lee | .................... | H01M 8/04089 701/22 |

* cited by examiner

*Primary Examiner* — Son Le
(74) *Attorney, Agent, or Firm* — Skyler R. Lund

(57) ABSTRACT

A method for measuring the isolation resistance between a chassis and a battery terminal in an electric vehicle. The method can include measuring an open voltage (VP(open)) of the positive terminal; measuring an open voltage (VN(open)) of the negative terminal; measuring a voltage (VN(S1 closed)) between the negative terminal and the chassis with switch S1 closed; measuring a voltage (VP(S1 closed)) between the positive terminal and the chassis with switch S1 closed; calculating the ratio (VP(open)/VN(closed)) of the voltages VP(open) and VN(closed); calculating the open ratio of the open voltages (VP(open)/VN(open)); calculating the difference between the ratio (VP(S1 closed)/VN(S1 closed)) and the open ratio (VP(open)/VN(open)); and multiplying the value of the test resistor (R0) by the difference between the ratio (VP(S1 closed)/(VN(S1 closed)) and the open ratio (VP(S2 open)/VN(S1 open)) to obtain the isolation resistance.

12 Claims, 5 Drawing Sheets

METHOD FOR MEASURING ELECTRICAL ISOLATION OF A VEHICLE CHASSIS

FIELD OF THE INVENTION

The invention relates generally to the electrical isolation of the chassis in electric vehicles and more specifically the measurement of such isolation.

BACKGROUND OF THE INVENTION

Electrically motorized vehicles such as electric vehicles (EV), hybrid electric vehicles (HEV), and fuel cell electric vehicles (FCEV) typically use high voltages (400-700 V) in the drive system to be able to provide high power to the drive motors. The distribution system for this high voltage is electrically isolated by insulation on the electric wires from the vehicle chassis. The isolation is designed to prevent an electrical shock hazard but can fail over time or due to a crash, which creates a potential electrocution hazard.

Society of Automotive Engineers standard SAE J1766 proposes a method to measure the insulation resistance in such a vehicle in order to monitor the health of the insulation system to insure the vehicle is safe to operate. In the SAEJ1766 test method, the voltage drop ($V_2$) between the high voltage positive terminal of the battery and the chassis and the voltage drop ($V_1$) between the high voltage negative terminal of the battery and the chassis are first individually measured.

To measure the effective isolation resistance ($R_2$) of the positive high voltage battery terminal to the chassis, the voltage drop ($V'_1$) across a test resistor ($R_0$) that is connected from the negative high voltage battery terminal (N) to the chassis is measured. This measurement is made after waiting for the voltage in the circuit to stabilize after the test resistor is connected, due to the RC time constant caused by test resistor and the suppression and parasitic capacitors in the system. The isolation resistance ($R_2$) is then calculated according to the equation:

$$R_2 = R_0(1+(V_2/V_1))((V_1-V'_1)/V'_1)$$

To measure the effective isolation resistance ($R_1$) from the negative high voltage battery terminal to the chassis, the voltage drop ($V'_2$) across a test resistor ($R_0$) that is connected from the positive high voltage terminal (P) to the chassis is next measured. Again, this measurement is made after waiting for the voltage to stabilize due to the voltage decay time constants caused by the suppression and parasitic capacitors in the system. The isolation resistance ($R_1$) is then given by:

$$R_1 = R_0(1+(V_1/V_2))((V_2-V'_2)/V'_2)$$

The decay of the voltage to steady state has a very long time constant (typically in the range of 15 seconds) due to the combination of: the electromagnetic compatibility (EMC) suppression filter capacitors; the parasitic capacitance between the chassis and the high voltage positive and negative terminals; and the large resistance value that is typically used for the test resistor. Therefore, to guarantee accurate results, one must wait a significantly long period of time after connecting the test resistor before taking a voltage measurement. This is problematic if an isolation measurement is to be undertaken while the vehicle is being driven. Because the battery has finite impedance as power passes into or out of the battery, the battery voltage varies significantly as current flows dynamically into or out of the battery.

Although the SAEJ1766 method utilizes both the initial high voltage positive and high voltage negative measurements to chassis, prior to connecting the test resistor, only a single (either positive or negative to chassis) measurement is obtained after connecting the test resistor and waiting the sufficiently long period for the RC time constant to decay. Because the differential high voltage value between the positive and negative battery terminals directly influences the individual positive and negative to chassis measurements, variations in the differential voltage will be reflected in variations in the positive or negative to chassis measurements. As a result, large errors may be introduced in any one measurement using the SAEJ1766 method. For this reason, prior art methods that used the SAEJ1766 standard generally either average many samples or alternatively performed some very low frequency filtering (either in the analysis software or as hardware based filters in the circuit) to mitigate the errors caused by the method.

In addition to the delay in measurement caused by the large time constant and the sensitivity to differential voltage fluctuations, the need to average multiple measurements further reduces the performance and response time of SAEJ1766 prior art measurement systems. Although the prior art SAEJ1766 methods could avoid the averaging of measurements by restricting the measurements to periods when the propulsion system is not active, this would dramatically limit the usefulness of the prior art approach.

What is needed is a method that: is useful in measuring the degree of isolation of chassis from the electrical system; is insensitive to variations in battery voltage and is without the delays engendered by excessive filtering or multiple measurements.

The present invention addresses this need.

SUMMARY OF THE INVENTION

In one aspect, the invention relates to a method of determining the isolation resistance between a chassis and a battery having a positive terminal and a negative terminal. In one embodiment, the method includes the steps of: measuring an open voltage (VP(open)) of the positive terminal; measuring an open voltage (VN(open)) of the negative terminal; closing switch S1 to connect resistor S1 between negative terminal and chassis; measuring a voltage (VN(S1 closed)) between the negative terminal and the chassis while switch S1 is closed; measuring a voltage (VP(S1 closed)) between positive terminal and chassis while switch S1 is closed; calculating the ratio (VP(S1 closed)/VN(S1 closed)) of the voltages VP(S1 closed) and VN(S1 closed); calculating the open ratio of the open voltages (VP(open)/VN (open)); calculating the difference between the ratio (VP(S1 closed)/VN(S1 closed)) and the open ratio (VP(S2 open)/ VN(S1 open)); and multiplying the value of the test resistor ($R_0$) by the difference between the ratio (VP(S1 closed)/VN (S1 closed)) and the open ratio (VP(S2 open)/VN(S1 open)) to obtain the isolation resistance.

In another embodiment the voltage VN is measured across a test resistor. In yet another embodiment the test resistor is 4M Ohms to 10 M Ohms. In still yet another embodiment switch S1 is an optoisolated MOSFET switch. In still another embodiment the method further includes the step of isolating the battery if the isolation resistance is determined to be less that a specified value. In another embodiment the determination of isolation resistance is made while the battery is supplying power to a motor.

In another aspect, the invention relates to a method of determining an isolation resistance between a chassis and a battery, the battery having a positive terminal and a negative terminal. In another embodiment, the method includes the steps of: measuring an open voltage (VP(open)) of the positive terminal; measuring an open voltage (VN(open)) of the negative terminal; measuring a voltage (VP(S2 closed)) between the positive terminal and the chassis while switch S2 is closed; measuring a voltage (VN(S2 closed)) between the negative terminal and the chassis while switch S2 is closed; calculating the ratio (VN(S2 closed)/VP(S2 closed)) of the voltages VP(S2 closed) and VN(S2 closed); calculating the open ratio of the open voltages (VN(open)/VP(open)); calculating the difference between the ratio (VN(S2 closed)/VP(S2 closed)) and the open ratio (VN(open)/VP(open)); and multiplying the value of the test resistor ($R_0$) by the difference between the ratio (VN(S2 closed)/VP(S2 closed)) and the open ratio (VN(open)/VP(open)) to obtain the isolation resistance.

In another embodiment the voltage VP is measured across a test resistor. In still another embodiment the test resistor is 4M Ohms to 10 M Ohms. In yet another embodiment switch S2 is an optoisolated MOSFET switch. In still yet another embodiment the method further includes the step of isolating the battery if the isolation resistance is determined to be less that a specified value. In another embodiment the determination of isolation resistance is made while the battery is supplying power to a motor.

BRIEF DESCRIPTION OF THE DRAWINGS

The structure and function of the invention can be best understood from the description herein in conjunction with the accompanying figures. The figures are not necessarily to scale, emphasis instead generally being placed upon illustrative principles. The figures are to be considered illustrative in all aspects and are not intended to limit the invention, the scope of which is defined only by the claims.

DESCRIPTION OF A PREFERRED EMBODIMENT

The method of the invention eliminates the sensitivity of the measurement of the isolation resistance calculation to differential high voltage changes occurring in the circuit during measurement. As a result, a very accurate isolation resistance measurement can be obtained even while battery voltage is widely varying during the test period. This allows for a more accurate assessment of the quality of the electrical insulation, while providing significantly faster evaluation time. The significantly improved resistance estimation allows for less averaging and filtering resulting in quicker detection of isolation resistance failures.

Figure 1:
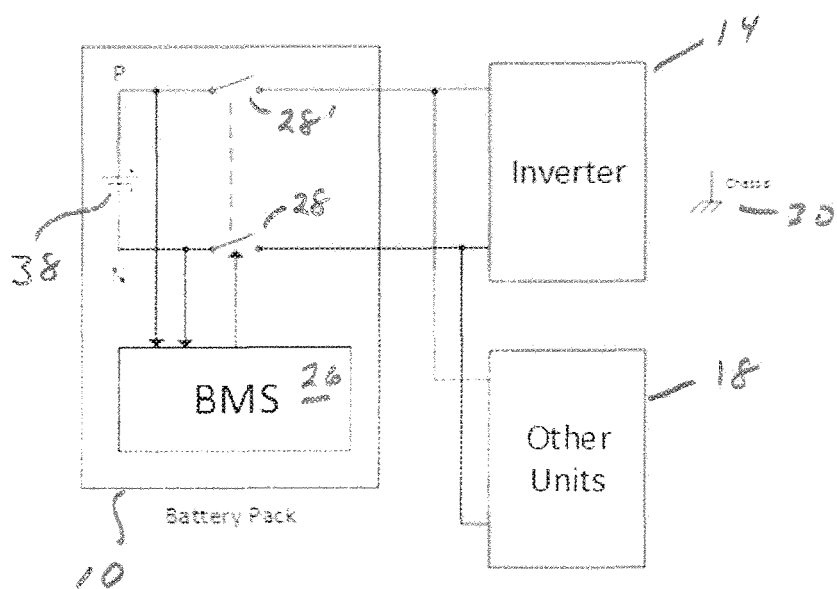
FIG. 1 is a block diagram of an embodiment of a battery management circuit integrated into an automobile electrical system.

Referring to FIG. 1, an embodiment of a vehicle electrical system is depicted with a battery pack 10 connected to an inverter 14 and other electrical components 18 that draw current from the battery pack 10. The battery pack 10 includes a battery 38, a battery management system 26 that monitors the battery voltage, and a pair of relays 28, 28' controlled by the battery management system 26 to connect and disconnect the battery 38 from the rest of the automobile circuits in the event that the battery management system 26 detects isolation failure between the battery 38 and a chassis 30. In one embodiment the battery 38 produces 200-400V. The battery management system 26 measures the voltage at various points in the circuit through contacts connected to analog to digital (A/D) converters connected to a processor that are part of the battery management system 26.

Figure 2:
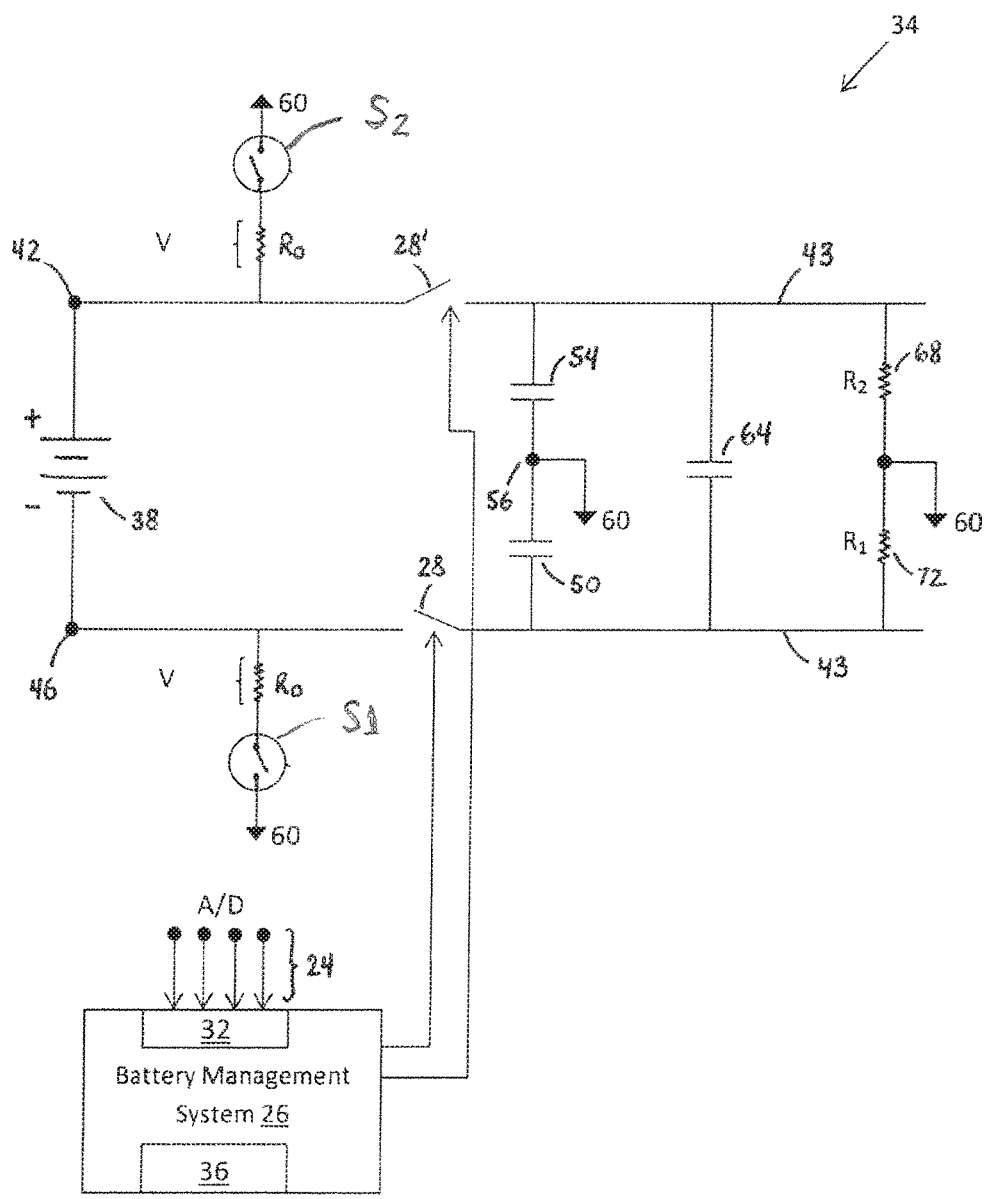
FIG. 2 is a schematic diagram of an embodiment of the isolation measurement circuit of the invention.

Referring to FIG. 2, an electrical isolation measurement circuit 34 of the invention includes a battery 38 that provides a positive (P) terminal 42 and a negative (N) terminal 46 for a vehicle electric power supply bus 43. The circuit 34 includes two filter capacitors 50, 54 connected in series across the positive (P) 42 and negative (N) 46 terminals to filter the common mode noise. In one embodiment the filter capacitors are 1.0 µF. The common junction 56 of capacitors 50, 54 is connected to the chassis 60. A single differential filter capacitor 64 is connected between the positive (P) terminal 42 and the negative (N) terminal 46 to filter the differential noise. In one embodiment the differential capacitor is 1000 µF. Capacitors 50, 54, and 64 could be located inside inverter 14, or represent the combined capacitances of all capacitors attached to high voltage bus including inverter 14 and other units 18. Resistors ($R_2$) 68 and ($R_1$) 72 connected respectively from each terminal 42, 46 to the chassis 60 represent the effective resistance comprising the other resistances by other circuits 18 (FIG. 1) connected between the battery terminals (P) 42, (N) 46 and chassis 60 of the automobile and any leakage through the bus insulation due to a degraded or failed insulation system. Two relays 28, 28', under control of the battery management system 26, isolate the terminals 42, 46 of the battery 38 if the battery management system 26 determines that degradation or failure of the insulation to the chassis 60 is occurring.

One function of the battery management system 26 is to measure these isolation resistances 68 and 72 to determine if the isolation resistance has reduced to a dangerous level. To accomplish this, a test resistor $R_0$ is connected between the positive terminal (P) 42 and the chassis 60 through a switch S2. Similarly, another test resistor $R_{0\ is}$ attached between the negative terminal (N) 46 and the chassis 60, through a second switch S1. In one embodiment the test resistor is 4M-10M Ohms. In one embodiment the switches are optoisolated MOSFET switches (IXYS Clare, Milpitas, Calif.).

In this discussion the following nomenclature is used: Vterminal(switch state) is the voltage measured from the battery terminal (P or N) to the chassis 60 for a given switch state of switches S1 and S2. Possible switch states are one of the individual switches being closed (S1 closed or S2 closed), or both open (open and open). The system does not close both switches S1 and S2 simultaneously. Thus VP(open) is the open terminal voltage from terminal (P) 42 to the chassis when both switches are open. VP(S2 closed) is the voltage from the positive terminal to chassis when the switch S2 is closed. VN(S2 closed) is the voltage from the negative terminal to chassis when the switch S2 is closed. The same nomenclature is used in describing the voltages due to the state of switch S1.

In general, the manner in which the isolation resistance measurement is made is to first measure the open voltages VP(open), VN(open) of each respective terminal (P) 42, (N) 46 of the battery 38 with respect to chassis 60. Next a measurement of the isolation resistance of each terminal (P) 42, (N) 46 of the battery 38 is made by connecting the other terminal of the battery (N) 46, (P) 42, respectively, to the chassis 60 through the test resistor $R_0$. In this embodiment both test resistors $R_0$ have the same value, but this is not necessary.

Figure 3A:
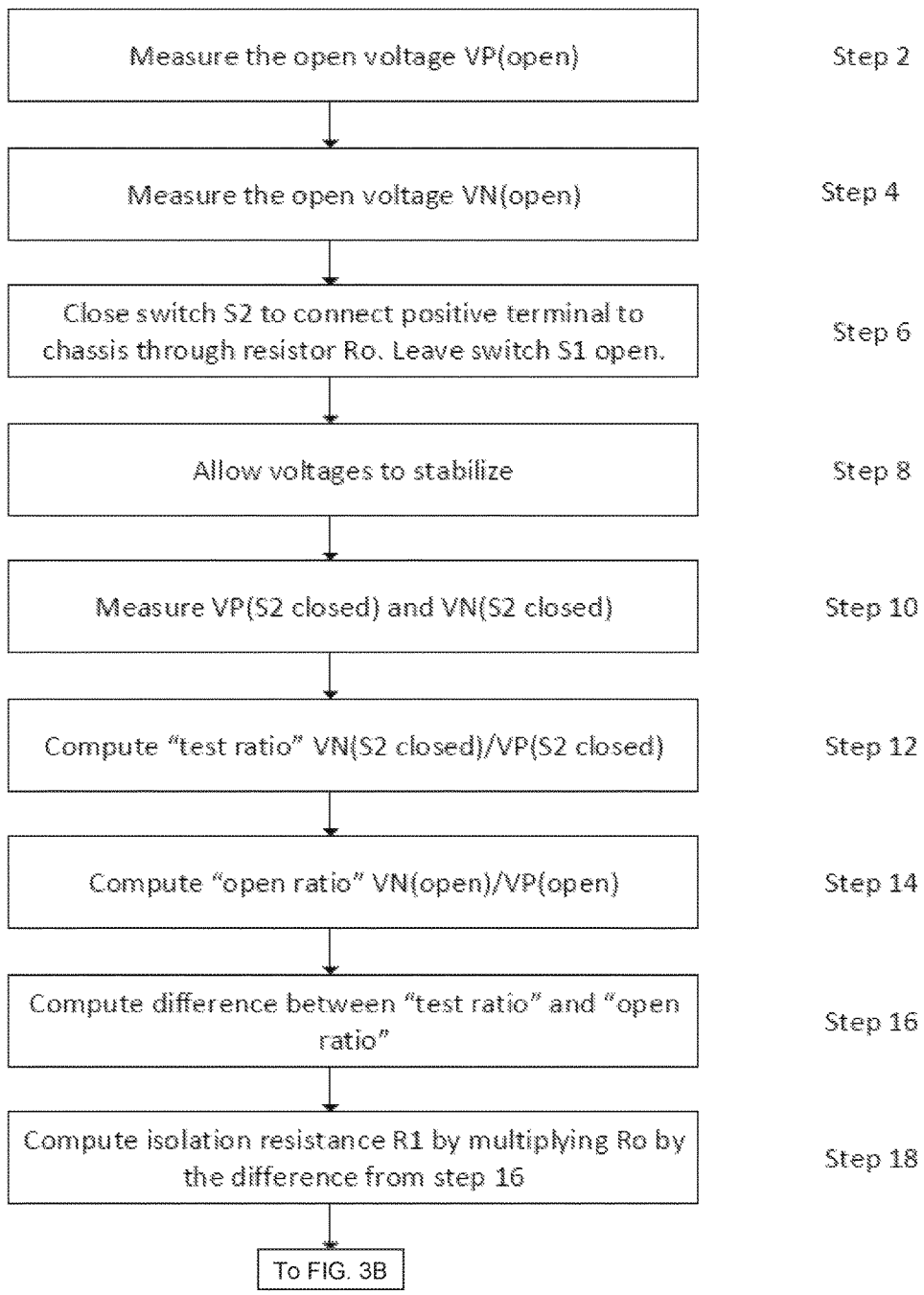
FIG. 3A and FIG. 3B are a flow chart of the measurement steps of the embodiment of the circuit of FIG. 2.
Figure 3B:
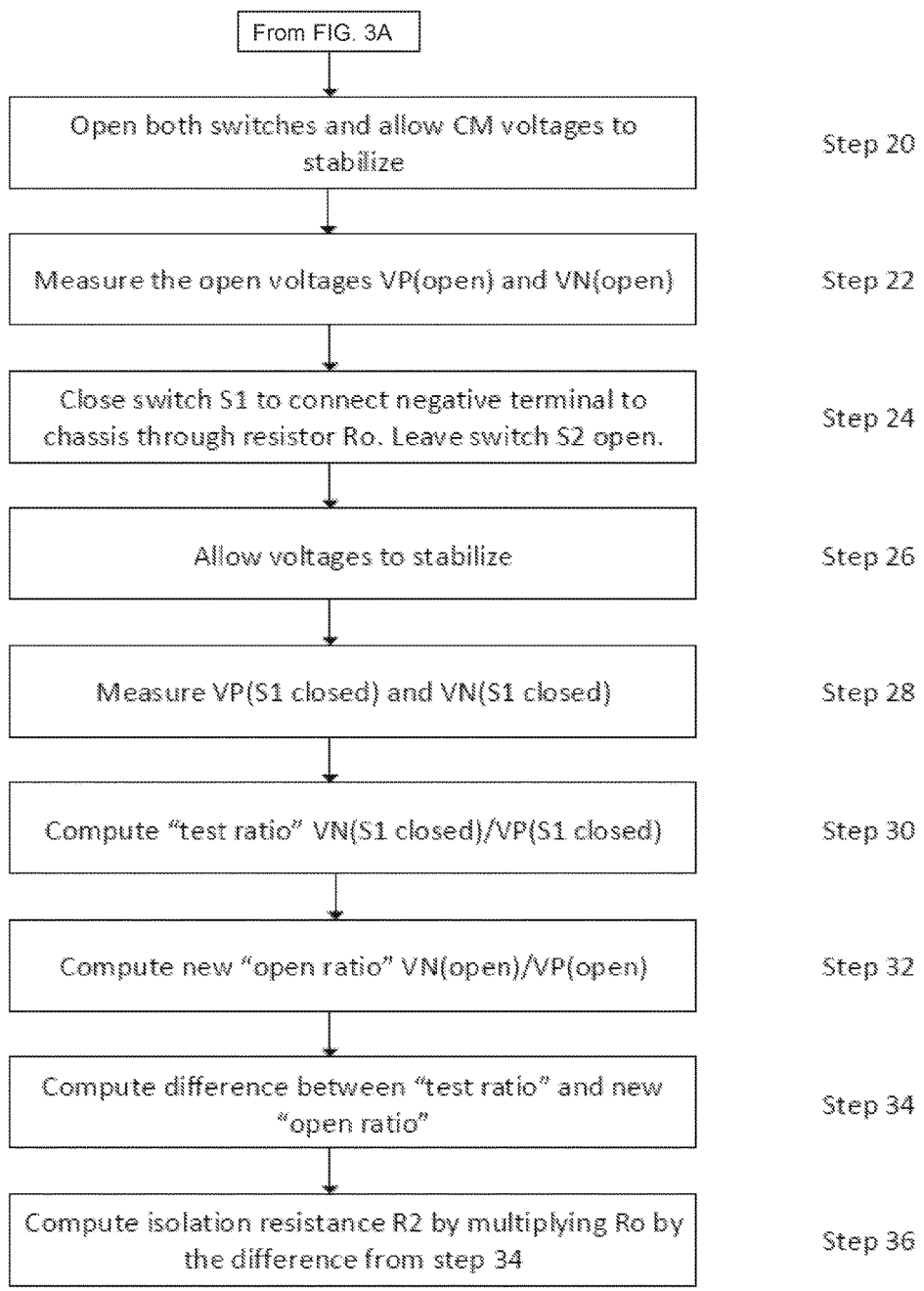

For example, referring also to FIG. 3, to make a measurement of the effective isolation resistance $R_1$, the open voltages VP(open) and VN(open) of the positive terminal (P) 42 of the battery 38 and the negative terminal (N) 46 of the battery 38, respectively, are measured independently (Step 2) and (Step 4), with both switches S2 and S1 open. The switch S2 is then closed (Step 6), connecting the positive terminal (P) 42 to the chassis 60 through the test resistor $R_0$ while the second switch S1 remains open. The voltage fluctuations are then allowed to decay (Step 8). The test voltage VP(S2 closed) at the terminal (P) 42 relative to the chassis 60 is measured across the test resistor $R_0$, and the voltage V(N)(S2 closed) at the terminal (N) 46 relative to the chassis 60 is again measured (Step 10).

The "test ratio" (VN(S2 closed)/VP(S2 closed)) of the test voltages VP(S2 closed) and V(N)(S2 closed) with the positive terminal (P) 42 connected to the chassis 60 is calculated (Step 12). The "open ratio" of the open voltages (VN(open)/VP(open)) with the terminals (P) 42, (N) 46 disconnected from the chassis is also calculated (Step 14). The difference between the test ratio (VN(S1 open)/VP(S2 closed)) and the open ratio (VN(S1 open)/VP(S2 open)) is then calculated (Step 16). The value of resistor $R_0$ is multiplied (Step 18) by the difference between the test ratio and the open ratio. The result is the effective isolation resistance $R_1$. The effective isolation value may be written as:

$$R_1 = R_0((VN(S2\ closed)/VP(S2\ closed)) - (VN(open)/VP(open)))$$

The process may then be repeated to calculate the effective isolation resistance $R_2$. Both switches S2 and S1 are opened and the common mode voltage is allowed to stabilize (Step 20). The new open voltages VN(open) and VP(open) are again measured (Step 22). The terminal (N) 46 is connected to the chassis 60 through the other test resistor $R_0$ by closing the switch S1 (Step 24). The voltage fluctuations are again allowed to decay and stabilize (Step 26). The test voltage VN(S1 closed) at the negative terminal (N) 46 relative to the chassis 60 is measured, and the voltage VP(S1 closed) at the terminal (P) 42 relative to the chassis 60 is again measured (Step 28). The test ratio (VP(S1 closed)/VN(S1 closed)) and the open ratio (VP(open)/VN(open)) are then calculated (Step 30 and Step 32). The difference between the test ratio and the open ratio (V P(S1 closed)/VN(S1 closed))−(P(open)/VN(open)) is calculated (Step 34). The effective isolation value $R_2$ is calculated as the test resistance $R_0$ multiplied by the difference between the test ratio and the open ratio (Step 36). This may be written as:

$$R_2 = R_0((VP(S2\ open)/VN(S1\ closed)) - (VP(S2\ open)/VN(S1\ open)))$$

The $R_1$ and $R_2$ values measured are a combination of the leakage resistance through the insulation of power bus and the resistance of the other circuits connected to the bus. By setting the lowest values of $R_1$ and $R_2$ that are permissible, one can decide at what value the insulation resistance has become too low, indicating a dangerous condition.

The battery management system 26 includes A/D converters 32 that convert the measured analog voltages at contacts 24 (actual point of measurement not shown for clarity) and pass the digital values to a processor 36. The processor 36 also controls relays 28, 28' and is capable of opening the relays 28, 28' if the processor 36 determines that the effective isolation resistance $R_1$ or $R_2$ is less than the desired value, indicating a low resistance to chassis 60.

Figure 4:
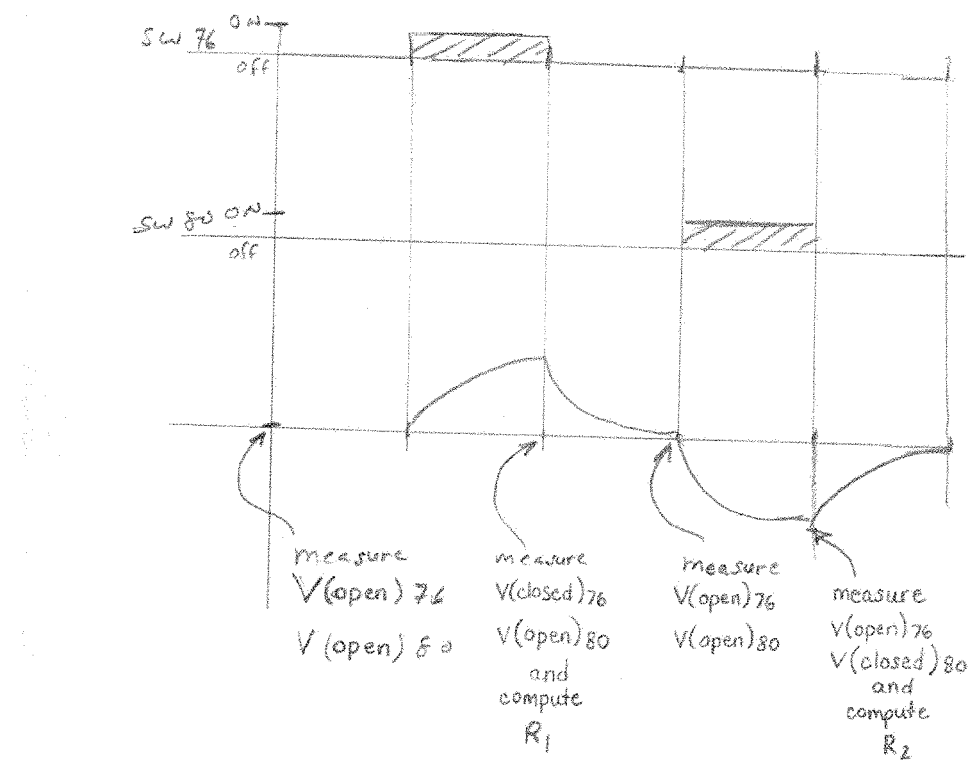
FIG. 4 is a waveform of the voltage measurement made in a simulation of the circuit of FIG. 2 according to the method of FIG. 3.

Referring to FIG. 4, the voltage at the negative terminal (N) 46 is shown in response to the method steps in FIG. 3. Initially both switches S2 and S1 are open and voltages VP(open) and VN(open) are measured. The switch S2 is then turned on and VP(S2 closed) and VN(S2 closed) are measured. From these values, the effective isolation resistance $R_1$ is computed. Next both switches are turned off again and voltages VP(open) and VN(open) are again measured. Switch S1 is then turned on. Voltages VP(S1 closed) and VN(S1 closed) are measured and $R_2$ is calculated.

By measuring $R_1$ and $R_2$ the system can detect if the chassis is isolated from the battery voltage to a degree necessary for safety for the given battery configuration.

Unless otherwise indicated, all numbers expressing lengths, widths, depths, or other dimensions and so forth used in the specification and claims are to be understood in all instances as indicating both the exact values as shown and as being modified by the term "about." The term about includes the nominal value recited±10%. Accordingly, unless indicated to the contrary, the numerical parameters set forth in the specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques. Any specific value may vary by 20%.

The terms "a," "an," "the," and similar referents used in the context of describing the invention (especially in the context of the following claims) are to be construed to cover both the singular and the plural, unless otherwise indicated herein or clearly contradicted by context. All methods described herein can be performed in any suitable order unless otherwise indicated herein or otherwise clearly contradicted by context. The use of any and all examples, or exemplary language (e.g., "such as") provided herein is intended merely to better illuminate the invention and does not pose a limitation on the scope of any claim. No language in the specification should be construed as indicating any non-claimed element essential to the practice of the invention.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified, thus fulfilling the written description of all Markush groups used in the appended claims.

Certain embodiments are described herein, including e best mode known to the inventor for carrying out the spirit of the present disclosure. Of course, variations on these described embodiments will become apparent to those of ordinary skill in the art upon reading the foregoing description. The inventor expects skilled artisans to employ such variations as appropriate, and the inventor intends for the invention to be practiced otherwise than specifically described herein. Accordingly, the claims include all modifications and equivalents of the subject matter recited in the claims as permitted by applicable law. Moreover, any combination of the above-described elements in all possible variations thereof is contemplated unless otherwise indicated herein or otherwise clearly contradicted by context.

In closing, it is to be understood that the embodiments disclosed herein are illustrative of the principles of the claims. Other modifications that may be employed are within the scope of the claims. Thus, by way of example, but not of limitation, alternative embodiments may be utilized in accordance with the teachings herein. Accordingly, the claims are not limited to embodiments precisely as shown and described.

What is claimed is:

1. A method of determining an isolation resistance between a chassis and a battery, the battery having a positive terminal and a negative terminal, the positive terminal connectable to the chassis via a switch S2, the negative terminal connectable to the chassis via a switch S1, the method comprising the steps of:
   opening both switch S1 and switch S2;
   measuring an open voltage (VP(open)) of the positive terminal when both switch S1 and switch S2 are open;
   measuring an open voltage (VN(open)) of the negative terminal when both switch S1 and switch S2 are open;
   closing switch S1 while leaving switch S2 open;
   measuring a voltage (VN(S1 closed)) between the negative terminal and the chassis with switch S1 closed;
   measuring a voltage (VP(S1 closed)) between the positive terminal and the chassis with switch S1 closed;
   calculating the ratio (VP(S1 closed)/VN(S1 closed)) of the voltages VP(S1 closed) and VN(S1 closed);
   calculating the open ratio of the open voltages (VP(open)/VN(open);
   calculating the difference between the ratio (VP(S1 closed)/VN(S1 closed)) and the open ratio (VP(open)/VN(open)); and
   multiplying the value of a test resistor by the difference between the ratio (VP(S1 closed)/VN(S1 closed)) and the open ratio (VP(open)/VN(open)) to obtain the isolation resistance.

2. The method of claim 1 wherein the voltage VN(S1 closed) is measured across the test resistor.

3. The method of claim 2 wherein the test resistor is 4M Ohms to 10 M Ohms.

4. The method of claim 1 wherein switch S1 is an isolated MOSFET switch.

5. The method of claim 1 wherein further comprising the step of isolating the battery if the isolation resistance is determined to be less than a specified value.

6. The method of claim 1 wherein the determination of isolation resistance is made while the battery is supplying power to a motor.

7. A method of determining an isolation resistance between a chassis and a battery, the battery having a positive terminal and a negative terminal, the positive terminal connectable to the chassis via a switch S2, the negative terminal connectable to the chassis via a switch S1, the method comprising the steps of:
   opening both switch S1 and switch S2;
   measuring an open voltage (VP(open)) of the positive terminal when both switch S1 and switch S2 are open;
   measuring an open voltage (VN(open)) of the negative terminal when both switch S1 and switch S2 are open;
   closing switch S2 while leaving switch S1 open;
   measuring a voltage (VN(S2 closed)) between the positive terminal and the chassis with switch S2 closed;
   measuring a voltage (VP(S2 closed)) between the positive terminal and the chassis with switch S2 closed;
   calculating the ratio (VN(S2 closed)/VP(S2 closed)) of the voltages VP(S2 closed) and VN(S2 closed);
   calculating the open ratio of the open voltages (VN(open)/VP(open));
   calculating the difference between the ratio (VN(S2 closed)/VP(S2 closed)) and the open ratio (VN(open)/VP(open)); and
   multiplying the value of a test resistor by the difference between the ratio (VN(S2 closed)/VP(S2 closed)) and the open ratio (VN(open)/VP(open)) to obtain the isolation resistance.

8. The method of claim 7 wherein the voltage VP(S2 closed) is measured across the test resistor.

9. The method of claim 8 wherein the test resistor is 4M Ohms to 10 M Ohms.

10. The method of claim 7 wherein switch S2 is an optoisolated MOSFET switch.

11. The method of claim 7 wherein further comprising the step of isolating the battery if the isolation resistance is determined to be less than a specified value.

12. The method of claim 7 wherein the determination of isolation resistance is made while the battery is supplying power to a motor.

* * * * *